United States Patent [19]

Sundaram

[11] Patent Number: 5,486,481
[45] Date of Patent: Jan. 23, 1996

[54] METHOD FOR FORMING A LATERAL BIPOLAR TRANSISTOR

[75] Inventor: Lalgudi M. G. Sundaram, Scottsdale, Ariz.

[73] Assignee: Motorola, Inc., Schaumburg, Ill.

[21] Appl. No.: 342,476

[22] Filed: Nov. 21, 1994

Related U.S. Application Data

[62] Division of Ser. No. 801,282, Dec. 2, 1991, Pat. No. 5,397,912.

[51] Int. Cl.$^6$ ............................................. H01L 21/8222
[52] U.S. Cl. ............................. 437/31; 437/32; 437/917; 148/DIG. 96
[58] Field of Search ............................ 437/31, 32, 917, 437/162; 148/DIG. 96

[56] References Cited

U.S. PATENT DOCUMENTS

| | | | |
|---|---|---|---|
| 4,259,680 | 3/1981 | Lepselter et al. | 257/558 |
| 4,704,786 | 11/1987 | Kub | 148/DIG. 11 |
| 4,733,287 | 3/1988 | Bower | 257/554 |
| 4,753,709 | 6/1988 | Welch et al. | 257/587 |
| 4,965,872 | 10/1990 | Vasudev | 257/558 |
| 4,994,406 | 2/1991 | Vasquez et al. | 437/67 |
| 5,026,663 | 6/1991 | Zdebel et al. | 437/160 |
| 5,027,184 | 6/1991 | Soclof | 257/557 |
| 5,031,014 | 7/1991 | Soclof | 257/557 |
| 5,047,828 | 9/1991 | Soclof | 257/526 |
| 5,065,208 | 11/1991 | Shah et al. | 257/587 |

FOREIGN PATENT DOCUMENTS

| | | | |
|---|---|---|---|
| 0102075 | 3/1984 | European Pat. Off. | 257/587 |
| 5711151 | 3/1982 | Japan | 257/755 |
| 0292673 | 11/1988 | Japan . | |
| 0068536 | 3/1992 | Japan | 437/78 |

*Primary Examiner*—Tuan H. Nguyen
*Attorney, Agent, or Firm*—Kevin B. Jackson

[57] ABSTRACT

A lateral bipolar transistor structure (10) formed in a laterally isolated semiconductor device tub (22) of a first conductivity type is provided. First and second trenches are etched in the device tub and filled with doped polysilicon of a second conductivity type to form an emitter (30) and a collector (32). The portion of the tub (22) between the emitter (30) and collector (32) regions forms a base region. This configuration provides high emitter area and minimal device surface area, as well as emitter (30) and collector (32) regions which are interchangeable, greatly easing layout of integrated circuits using the transistor structure (10).

18 Claims, 1 Drawing Sheet

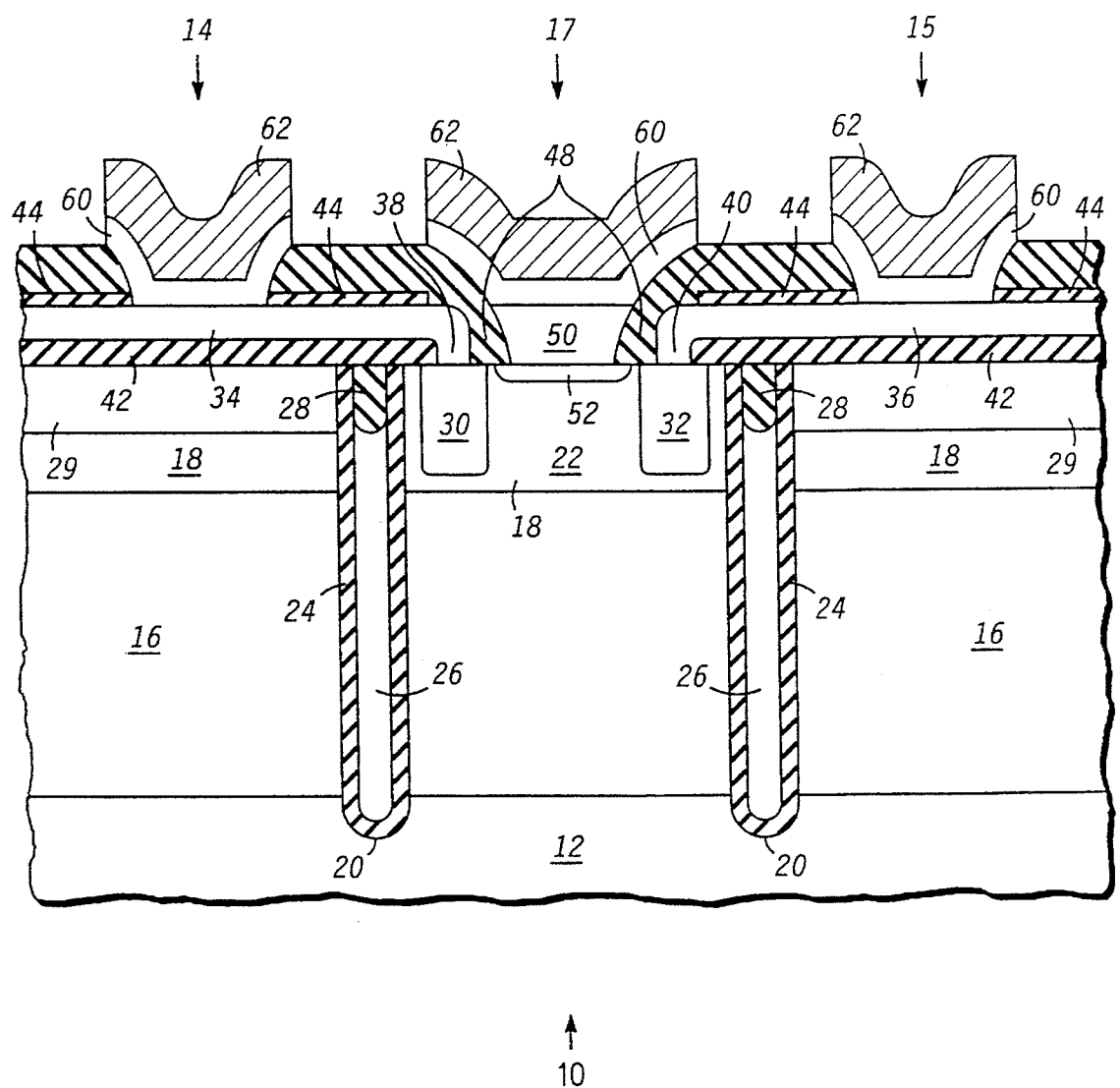

METHOD FOR FORMING A LATERAL BIPOLAR TRANSISTOR

This is a division of application Ser. No. 07/801,282, filed Dec. 2, 1991 U.S. Pat. No. 5,397,912.

FIELD OF THE INVENTION

This invention relates, in general, to semiconductor devices and more particularly to a lateral bipolar transistor.

BACKGROUND OF THE INVENTION

Bipolar transistors are well known in the semiconductor arts. Many bipolar transistors include a doped tub having a base region of the opposite conductivity type formed therein. An emitter region of the same conductivity type as the doped tub is formed in the doped base region. The doped tub serves as a collector. An emitter electrode contacts the emitter region directly above the doped tub while the base contact is laterally removed from the base region itself to minimize size of the base region and improve device performance. The collector electrode usually couples to a buried layer which is heavily doped the same conductivity type as the tub and is positioned underneath the tub.

One problem with conventional bipolar transistors is that the diffused junctions require high temperature diffusion cycles which makes formation of bipolar transistors incompatible with field effect devices, which normally required low temperature processing. Another problem is that collector and emitter electrodes are not interchangeable, complicating layout of integrated circuits using the devices. Still another difficulty is that device characteristics are highly sensitive to base width, which is determined by process control of both photolithography process steps and diffusion process steps. Diffusion steps in particular are difficult to control when making transistors with sub-micrometer features.

Another problem with bipolar transistors is that base resistance is high in this type of structure because the active base is not directly contacted. The high base resistance inhibits frequency and AC performance. Further, the base region must be large to have an emitter region formed therein and still function properly. This large base region requires increased device size, causes out-diffusion problems and creates high junction capacitance. Because the active area is large, the base to substrate capacitance is also large. The large base width causes transit time through the base region to be large.

A partial solution to these problems is provided by lateral bipolar transistors which include a central base region and emitter and collector regions formed on either side of the base region. All of the device regions of a lateral bipolar transistor can be contacted directly from the top surface of the device. Lateral bipolar transistors require deep junctions, however, to achieve acceptable performance. Deep junctions result in large geometry devices because of lateral diffusion. Until now, lateral bipolar transistors were either too large to be practical, or severely compromised electrical characteristics such as gain and current carrying capability.

In view of the above, it would be highly desirable to have a bipolar transistor structure that improves upon the above-identified problems encountered by standard bipolar transistors.

SUMMARY OF THE INVENTION

Briefly stated, a lateral bipolar transistor structure formed in a laterally isolated semiconductor device tub of a first conductivity type is provided. First and second trenches are etched in the device tub and filled with doped polysilicon of a second conductivity type to form an emitter region and a collector region. The portion of the tub between the emitter and collector regions forms a base region. This configuration provides high emitter area and minimal device surface area, as well as emitter and collector regions which are interchangeable, greatly easing layout of integrated circuits using the transistor structure.

BRIEF DESCRIPTION OF THE DRAWING

The single FIGURE is a highly enlarged cross sectional view of a lateral bipolar transistor in accordance with the present invention.

DETAILED DESCRIPTION OF THE DRAWING

The single FIGURE is a highly enlarged cross-sectional view of a lateral bipolar transistor 10 in accordance with the present invention. Transistor 10 is formed on a semiconductor substrate 12. In this embodiment, substrate 12 comprises monocrystalline silicon, has a P+ conductivity type and a dopant concentration on the order of $2 \times 10^{17}$ to $2 \times 10^{18}$ atoms/cm$^3$. A buried layer 16 is formed on substrate 12. Buried layer 16 is N+ conductivity type for PNP transistor or P+ conductivity type for an NPN transistor and a dopant concentration on the order of $3 \times 10^{19}$ to $5 \times 10^{19}$ atoms/cm$^3$. An epitaxial layer 18 is formed on buried. layer 16. Epitaxial layer 18 also comprises epitaxial silicon and has an N conductivity type for a PNP transistor or P conductivity type for an NPN transistor. Dopant concentration for epitaxial layer 18 is in the range of $1 \times 10^{16}$ to $2 \times 10^{16}$ atoms/cm$^3$. N conductivity type layers and regions depicted in the FIGURE are doped with N type dopants such as arsenic, antimony or phosphorous. P conductivity type layers and regions are doped with P type dopants such as boron.

Isolation trenches 20 extend through epitaxial layer 18, buried layer 16, and into substrate 12. Trenches 20 laterally isolate an active device tub 22 which is the portion of epitaxial layer 18 disposed between trenches 20. In the preferred embodiment, trenches 20 include a trench liner 24 comprising dielectric material. In the preferred embodiment, trench liner 24 comprises an oxide layer formed on the sidewalls of trenches 20. It should be understood that other dielectric schemes may also be used. Trenches 20 are further filled with polysilicon 26. The top portion of polysilicon 26 is thermally oxidized to form a cap 28 thereover. Cap 28 isolates polysilicon 26 of trenches 20. Portions 29 of epitaxial layer 18 disposed laterally outside of trenches 20 are oxidized simultaneously with cap 28.

An example of a process for forming isolation trenches 20 is set forth in U.S. Pat. No. 4,994,406 issued on Feb. 19, 1991 to B. Vasquez and P. Zdebel entitled "Method of Fabricating Semiconductor Devices Having Deep and Shallow Isolation Structures". The isolation trenches described above and depicted by the single FIGURE is merely exemplary; the present invention may be utilized with various other isolation structures not depicted herein.

Disposed in active device tub 22 is emitter trench 30 and collector trench 32. Emitter trench 30 and collector trench 32 are both filled with polycrystalline semiconductor material of a P+ conductivity type for a PNP transistor or N+ conductivity type for an NPN transistor having a surface dopant concentrations on the order of $1 \times 10^{19}$ to $1 \times 10^{20}$ atoms/cm$^3$. In a preferred embodiment, emitter trench 30 and collector trench 32 are separated by a distance on the order of 0.1 to 1.0 micrometers.

In the preferred embodiment, emitter trench 30 and collector trench 32 are formed by etching vertical trenches into active device tub 22 and subsequently filling the trenches with doped polysilicon. The process steps used to form emitter trench 30 and collector trench 32 are substantially the same as described hereinbefore in reference to formation of isolation trenches 20. It should be understood that dielectric liner 24 and cap dielectric 28, used to form isolation trenches 20, are not used to form emitter trench 30 and collector trench 32. Hereinafter, emitter trench 30 and collector trench 32 are alternatively referred to as emitter region 30 and collector region 32, respectively.

Emitter trench 30 has a large emitter area despite the fact that it requires minimal surface area. A portion of active device tub 22 which lies between emitter trench 30 and collector trench 32 forms a base for the lateral transistor. Thus, emitter trench 30 and collector trench 32 are self-aligned to the base, and a single photolithography step used to form emitter trench 30 and collector trench 32 also defines base width for the transistor. Base width is the spacing between emitter trench 30 and collector trench 32, and is in the range of a few tenths of a micrometer. An important feature of the preferred embodiment is that the base width is substantially determined by a single photolithography step, and is not subject to deviations which arise from thermal diffusion processes.

In the preferred embodiment, first polysilicon extension 34 and second polysilicon extension 36 are used to couple emitter trench 30 to an emitter electrode 14 and collector trench 32 to a collector electrode 15. First and second polysilicon extensions 34 and 36 each have a P+ conductivity type for a PNP transistor and N+ conductivity type for an NPN transistor and a sheet resistance on the order of 50 to 150 ohms/square. Extensions 34 and 36 are coupled to first spacer 38 and second spacer 40, respectively. Spacers 38 and 40 comprise doped polysilicon and couple extensions 34 and 36 to emitter trench 30 and collector trench 32.

Polysilicon extensions 34 and 36 are shown to extend laterally beyond tub 22 and trenches 20. The portions of polysilicon extensions 34 and 36 extended laterally beyond tub 22 are isolated by nitride layer 42 and nitride layer 44. Dielectric spacers 48 isolate spacers 38 and 40 from base electrode 17. Polysilicon extensions 34 and 36 allow emitter and collector electrodes 14 and 15 to be located remotely from active device tub 22, which allows emitter trench 30 and collector trench 32 to be made smaller. Alternatively, electrodes 14 and 15 can be formed directly above emitter trench 30 and collector trench 32 using techniques well known in the semiconductor art.

A polysilicon plug 50 is formed between oxide spacers 48. Polysilicon plug 50 has an N+ conductivity type for a PNP transistor and a P+ conductivity type for an NPN transistor. Polysilicon plug has a dopant concentration greater than $1\times10^{20}$ atoms/cm$^3$. A base enhancement region 52 can be diffused into tub 22 from polysilicon plug 50 if desired. This forms a monosilicon enhanced doping contact region to the active base region. As shown, base enhancement region 52 is diffused between emitter trench 30 and collector trench 32. Base enhancement region 52 is contacted through polysilicon plug 50.

In the preferred embodiment, base electrode 17, emitter electrode 14, and collector electrode 15 comprise a silicide portion 60 disposed directly on polysilicon plug 50, first polysilicon extension 34 and second polysilicon extension 36, respectively. A metal portion 62 comprising a metal such as an aluminum alloy is formed directly on each silicide portion 60. Electrodes 14, 15 and 17 are formed by methods well known in the art.

The structure disclosed herein has many distinct advantages. Emitter region 30 and collector region 32 are substantially identical and so are interchangeable from a circuit layout standpoint. Both emitter region 30 and collector region 32 can be heavily doped to reduce resistance and improve performance. A large emitter area is provided while at the same time the structure is implemented with minimal surface area. Additionally, because base electrode 17 and polysilicon plug 50 are directly over base enhancement region 52, base resistance is reduced and frequency performance of transistor 10 is greatly enhanced.

The center placement of base enhancement region 52 allows tub 22 to be comparatively small. The small size of tub 22 improves frequency and greatly reduces base-substrate capacitance. Because polysilicon extensions 34 and 36 extend laterally beyond isolated tub 22, further scaling of the dimensions of tub 22 may occur independently of the lateral dimensions of electrodes 14, 15 and 17. Although the present invention is illustrated as a single cell having a one emitter, one base, and one collector region, it should be understood that a plurality of such regions can be formed to further increase emitter area and thus power handling capability. A plurality of emitter trenchs 30 and collector trenchs 32 may be formed in a single active device tub 22 in an interdigitated fashion as is commonly used in radio frequency bipolar transistor design. Only minor modifications of the present invention are needed to achieve such a design.

Thus it is apparent that there is provided, in accordance with the present invention a greatly improved lateral bipolar transistor. While specific embodiments of the invention have been shown and described, further modifications and improvements will occur to those skilled in the art. This invention is not limited to the particular form shown and the claims are intended to cover all modifications which do not depart from the spirit and scope of the invention.

We claim:

1. A method for making a lateral bipolar transistor comprising the steps of:

forming an isolated semiconductor tub of a first conductivity type;

etching a first trench and a second trench in the isolated semiconductor tub;

filling the first and second trenches with doped polycrystalline semiconductor material of a second conductivity type to form a first and a second filled trench, wherein the first filled trench forms an emitter region and the second filled trench forms a collector region, and wherein that portion of the semiconductor tub between emitter region and the collector region forms a base region;

forming a doped polycrystalline semiconductor layer of the first conductivity type on the isolated semiconductor tub between the emitter and collector regions;

forming a first spacer on the emitter region:

forming a second spacer on the collector region;

forming a first extension doped in the second conductivity type such that the first extension is coupled to the first spacer, wherein the first extension extends laterally beyond the isolated semiconductor tub;

forming a second extension doped in the second conductivity type such that the second extension is coupled to the second spacer, wherein the second extension extends laterally beyond the isolated semiconductor tub:

forming a base electrode on the doped polycrystalline semiconductor layer:

forming an emitter electrode on the first extension: and forming a collector electrode on the second extension.

2. The method of claim 1 wherein the step of etching the first trench and the second trench includes etching the first trench and the second trench such that the emitter region and the collector region are self-aligned to the base region.

3. The method of claim 1 wherein the step of etching the first trench and the second trench includes etching the first trench and the second trench such that the emitter region and the collector region are interchangeable.

4. The method of claim 1 further comprising the step of diffusing dopant of the first conductivity type from the doped polycrystalline semiconductor layer into the isolated semiconductor tub to form a base enhancement region.

5. The method of claim 1 wherein the steps of forming the emitter electrode and the collector electrode include forming the emitter electrode and the collector electrode such that the emitter electrode and the collector electrode are away from the isolated semiconductor tub.

6. The method of claim 1 wherein the steps of forming the first extension and the second extension include forming a first polysilicon extension and forming a second polysilicon extension, each having a sheet resistance on an order of 50 to 150 ohms/square.

7. The method of claim 1 wherein the step of forming the isolated semiconductor tub includes forming the isolated semiconductor tub having a dopant concentration on an order of $1 \times 10^{16}$ to $2 \times 10^{16}$ atoms/cm$^3$, and wherein the step of filling the first and second trenches includes filling the first and second trenches with the doped polycrystalline semiconductor material having a surface dopant concentration on an order of $1 \times 10^{19}$ to $1 \times 10^{20}$ atoms/cm$^3$, and wherein the step of forming the doped polycrystalline semiconductor layer includes forming the polycrystalline semiconductor layer having a dopant concentration greater than $1 \times 10^{20}$ atoms/cm$^3$.

8. A process for forming a bipolar semiconductor device comprising the steps of:

providing a substrate having an isolated active device region of a first conductivity type;

forming a filled vertical trench emitter region of a second conductivity type in the isolated active device region;

forming a filled vertical trench collector region of a second conductivity type in the isolated active device region, wherein the filled vertical trench emitter and collector regions are self-aligned and interchangeable, and wherein that portion of the isolated active device region between the filled vertical trench emitter and collector regions forms a base region;

forming a polycrystalline semiconductor region above the isolated active device region between the filled vertical trench emitter and collector regions, wherein the polycrystalline semiconductor region is doped with dopant of the first conductivity type;

forming first polysilicon spacer on the filled vertical trench emitter region:

forming a second polysilicon spacer on the filled vertical trench collector region, wherein the first and second polysilicon spacers are doped with dopant of the second conductivity type;

forming a first polysilicon extension above the isolated active device regions, wherein one end of the first polysilicon extension is coupled to the first polysilicon spacer, and wherein the first polysilicon extension is doped with dopant of the second conductivity type:

forming a second polysilicon extension above the isolated active device region, wherein one end of the second polysilicon extension is coupled to the second polysilicon spacer, and wherein the second polysilicon extension is doped with dopant of the second conductivity type;

forming a base ohmic contact on the polycrystalline semiconductor region;

forming an emitter ohmic contact on the first polysilicon extension: and forming a collector ohmic contact on the second polysilicon extension.

9. The process of claim 8 further comprising the step of diffusing dopant from the polycrystalline semiconductor region into the base region to form an enhancement region.

10. The process of claim 8 wherein the step of forming the base ohmic contact includes forming the base ohmic contact having a silicide portion disposed directly on the polycrystalline semiconductor region, and wherein the step of forming the emitter ohmic contact includes forming the emitter ohmic contact having a silicide portion disposed directly on the first polysilicon extension, and wherein the step of forming the collector ohmic contact includes forming the collector ohmic contact having a silicide portion disposed directly on the second polysilicon extension.

11. The process of claim 8 further comprising the step of forming dielectric spacers between the first and second polysilicon spacers and the polycrystalline semiconductor region.

12. The process of claim 8 wherein the steps of forming the first and second polysilicon extensions includes forming the first and second polysilicon extensions such that the first and second polysilicon extensions terminate beyond the isolated active device region.

13. The process of claim 8 wherein the steps of forming the first and second polysilicon extensions includes forming the first and second polysilicon extensions having a sheet resistance on an order of 50 to 150 ohms/square.

14. The process of claim 8 wherein the steps of forming the filled vertical trench emitter and collector regions include forming the filled vertical trench emitter and collector regions such that the filled vertical trench emitter and collector regions are separated by a distance on an order of 0.1 to 1.0 micrometers.

15. The process of claim 8 wherein the steps of forming the filled vertical trench emitter and collector regions include forming the filled vertical trench emitter and collector regions such that the filled vertical trench emitter and collector regions have a surface dopant concentration on an order of $1 \times 10^{19}$ to $1 \times 10^{20}$ atoms/cm$^3$.

16. The process of claim 8 wherein the step of forming the polycrystalline semiconductor region includes forming the polycrystalline semiconductor region having a dopant concentration greater than $1 \times 10^{20}$ atoms/cm$^3$.

17. A method for forming a lateral bipolar transistor structure comprising the step of:

forming a pair of filled vertical trenches of a first conductivity type in a semiconductor tub of a second conductivity type, wherein the filled vertical trenches are filled with a polycrystalline semiconductor material, and wherein the pair of filled vertical trenches are self-aligned and spaced a distance apart, and wherein that portion of the semiconductor tub between the pair of filled vertical trenches forms a base, and wherein one of the pair of filled vertical trenches forms an emitter and another of the pair of filled vertical trenches forms a collector;

forming a first spacer on the emitter;

forming a second spacer on the collector;

forming a first extension doped in the second conductivity type such that the first extension is coupled to the first spacer;

forming a second extension doped in the second conductivity type such that the second extension is coupled to the second spacer;

forming a base electrode coupled to the base;

forming an emitter electrode coupled to the first extension; and forming a collector electrode coupled to the second extension.

18. The method of claim 17 wherein the distance is on an order of 0.1 to 1.0 micrometers.

* * * * *